United States Patent
Watanabe et al.

(10) Patent No.: US 8,294,234 B2
(45) Date of Patent: Oct. 23, 2012

(54) MESA PHOTODIODE AND METHOD FOR MANUFACTURING THE SAME

(75) Inventors: Isao Watanabe, Kanagawa (JP); Tomoaki Koi, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 158 days.

(21) Appl. No.: 12/662,504

(22) Filed: Apr. 20, 2010

(65) Prior Publication Data

US 2010/0301440 A1    Dec. 2, 2010

(30) Foreign Application Priority Data

Jun. 2, 2009 (JP) ................. 2009-133054

(51) Int. Cl.
*H01L 31/0352* (2006.01)
*H01L 31/10* (2006.01)

(52) U.S. Cl. ........ 257/466; 257/414; 257/458; 257/436; 257/E31.053; 257/E31.032; 438/91

(58) Field of Classification Search .......... 257/436, 257/414, 458, E31.053, E31.032, 199, 438, 257/184, E31.064, E31.067, 466; 438/91, 438/46, 47
See application file for complete search history.

(56) References Cited

U.S. PATENT DOCUMENTS

| | | | | |
|---|---|---|---|---|
| 4,561,007 A * | 12/1985 | Webb | ................. | 257/438 |
| 5,148,267 A * | 9/1992 | Ty Tan et al. | ................. | 257/191 |
| 7,622,785 B2 | 11/2009 | Sasagawa et al. | | |
| 7,791,154 B2 | 9/2010 | Sasagawa et al. | | |
| 7,795,064 B2 * | 9/2010 | Pan et al. | ................. | 438/57 |
| 8,154,096 B2 | 4/2012 | Sasagawa et al. | | |
| 2005/0012030 A1 * | 1/2005 | Mahajan et al. | ........... | 250/214.1 |
| 2008/0121867 A1 | 5/2008 | Yagyu et al. | | |
| 2008/0191240 A1 | 8/2008 | Yagyu et al. | | |

FOREIGN PATENT DOCUMENTS

| | | |
|---|---|---|
| CN | 101438418 A | 5/2009 |
| JP | 2004-119563 | 4/2004 |
| JP | 2004-119563 A | 4/2004 |
| JP | 2008-28421 | 2/2008 |
| JP | 2008-66329 | 3/2008 |
| WO | WO 2006/046276 A1 | 5/2006 |
| WO | WO 2006/123410 A1 | 11/2006 |
| WO | WO 2007/125932 A1 | 11/2007 |

* cited by examiner

*Primary Examiner* — Tom Thomas
*Assistant Examiner* — Benjamin Tzu-Hung Liu
(74) *Attorney, Agent, or Firm* — McGinn IP Law Group, PLLC

(57) ABSTRACT

A mesa photodiode which includes a mesa, the sidewall of the mesa is a surface that is inclined in the direction in which the bottom of the mesa becomes wider. At least the sidewall of the mesa is covered with a semiconductor layer of a first conductivity type, a second conductivity type, a semi-insulating type, or an undoped type. The semiconductor layer is grown on at least the sidewall of the mesa. The inclined angle of the inclined surface of the mesa at the upper end portion is smaller than the inclined angle of the inclined surface of the mesa at the lower end portion.

13 Claims, 7 Drawing Sheets

MESA PHOTODIODE AND METHOD FOR MANUFACTURING THE SAME

This application is based on Japanese patent application No. 2009-133054, the content of which is incorporated herein by reference.

BACKGROUND

1. Technical Field

The present invention relates to a mesa photodiode and a method for manufacturing the mesa photodiode.

2. Related Art

Since the pn junction in a mesa photodiode can be formed through crystal growth, the position of the pn junction and the electric field distribution can be easily controlled in the mesa photodiode. To secure device reliability, it is necessary to cover the pn junction of the mesa photodiode with a passivation layer. In view of interfacial stability, the passivation layer is preferably a semiconductor layer.

For example, Japanese Laid-open Patent Publication Nos. 2008-66329 and 2004-119563 each disclose a technique of covering the pn junction of a mesa photodiode with a semiconductor layer.

The mesa PIN-PD shown in FIG. 2C of Japanese Laid-open Patent Publication No. 2008-66329 is a structure in which the InGaAs light-absorbing layer of the device is processed into a mesa, the sidewall of the mesa is buried with InP layer, which is regrown. With this arrangement, the contact between InGaAs with a small bandgap and a dielectric passivation film is restrained, or the existence of an interface between InGaAs having insufficient temporal stability and a dielectric layer is restrained. Instead, an interface between wide-bandgap InP having higher temporal stability (with the dark current not increasing with time) and InGaAs is formed, to secure long-term reliability.

In the mesa APD shown in FIG. 7 of Japanese Laid-open Patent Publication No. 2004-119563, the InGaAs light-absorbing layer of the device is processed into a mesa, and the sidewall of the mesa is buried with InP layer, which is regrown, to achieve the same effects as those achieved by Japanese Laid-open Patent Publication No. 2008-66329.

A buried layer formed in a region surrounding a mesa is also disclosed in each of the following references: International Publication Nos. 2006/123410, 2006/046276, and Japanese Laid-open Patent Publication No. 2008-28421.

SUMMARY

In one embodiment, there is provided a mesa photodiode including a stack structure that is formed on a semiconductor substrate. The stack structure is formed by stacking and growing a buffer layer made of a semiconductor of a first conductivity type, an etching stopper layer made of a semiconductor of the first conductivity type, a second conductivity type, or an undoped type, a light-absorbing layer made of a semiconductor of the first conductivity type, the second conductivity type, or the undoped conductivity type, and a double-layer semiconductor layer of the second conductivity type in this order. The double-layer semiconductor layer of the second conductivity type and the light-absorbing layer form a mesa. The sidewall of the mesa is an inclined surface that is inclined in the direction in which the bottom of the mesa becomes wider. At least the sidewall of the mesa is covered with a semiconductor layer that is grown on the sidewall, and the semiconductor layer is of the first conductivity type, the second conductivity type, a semi-insulating type, or the undoped type. The inclined angle of the inclined surface of the mesa at the upper end portion is smaller than the inclined angle of the inclined surface of the mesa at the lower end portion.

In another embodiment, there is provided a method for manufacturing a mesa photodiode. This method includes: forming a stack structure on a semiconductor substrate by stacking and growing a buffer layer made of a semiconductor of a first conductivity type, an etching stopper layer made of a semiconductor of the first conductivity type, a second conductivity type, or an undoped type, a light-absorbing layer made of a semiconductor of the first conductivity type, the second conductivity type, or the undoped conductivity type, and a double-layer semiconductor layer of the second conductivity type in this order; processing the double-layer semiconductor layer of the second conductivity type and the light-absorbing layer into a mesa; and covering at least the sidewall of the mesa with a semiconductor layer that is grown on the sidewall, the semiconductor layer being of the first conductivity type, the second conductivity type, a semi-insulating type, or the undoped type. In processing the double-layer semiconductor layer and the light-absorbing layer, the sidewall of the mesa is formed on an inclined surface that is inclined in the direction in which the bottom of the mesa becomes wider, and the inclined angle of the inclined surface of the mesa at the upper end portion is controlled to be smaller than the inclined angle of the inclined surface of the mesa at the lower end portion.

BRIEF DESCRIPTION OF THE DRAWINGS

The above and other objects, advantages and features of the present invention will be more apparent from the following description of certain preferred embodiments taken in conjunction with the accompanying drawings, in which.

DETAILED DESCRIPTION

Figure 1:
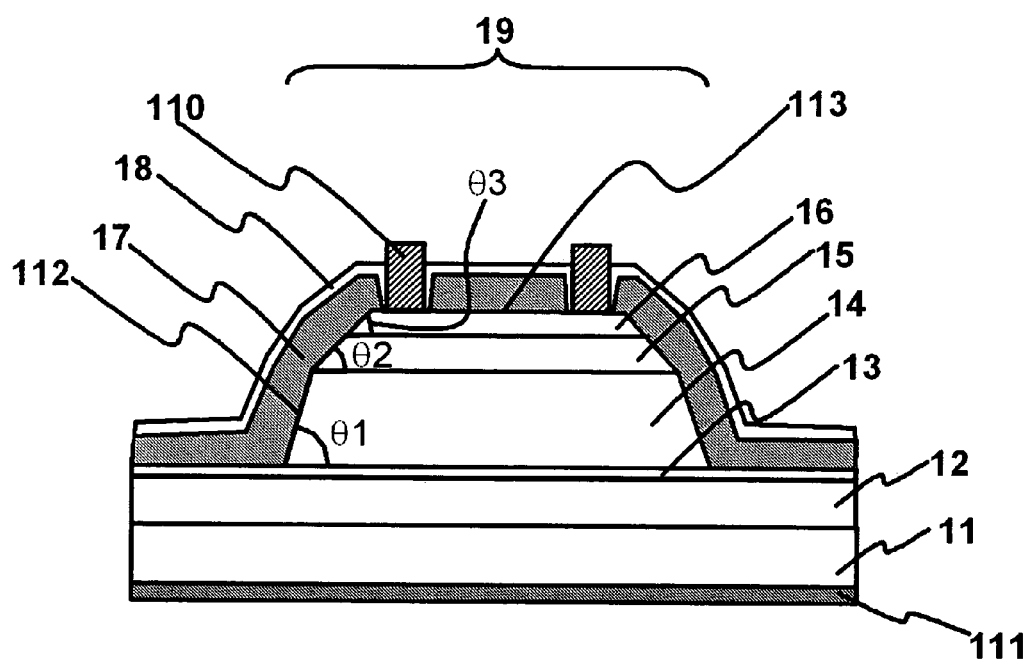
FIG. 1 is a cross-sectional view showing the structure of a mesa photodiode (a mesa PIN photodiode) according to a first embodiment.

According to Japanese Laid-open Patent Publication Nos. 2008-66329 and 2004-119563, the mesa sidewall covering properties of the buried semiconductor layer becomes insufficient due to the anisotropy of the crystal growth in the burying procedure that depends on the shape of the mesa.

By the technique disclosed in Japanese Laid-open Patent Publication No. 2008-66329, the covering properties of a regrown semiconductor layer becomes insufficient at the portion of a reverse mesa shape or an almost vertical mesa shape (at the boundary portion between the i-type III-V compound semiconductor film 15a and the III-V compound semiconductor film 17a of Japanese Laid-open Patent Publication No. 2008-66329), and the InGaAs light-absorbing layer (the i-type III-V compound semiconductor film p15a of Japanese Laid-open Patent Publication No. 2008-66329) is easily exposed. As a result, surface leakage dark current increases in the long run, and sufficiently high reliability of the mesa photodiode cannot be secured. If high reliability of the mesa photodiode is secured, the yield ratio becomes insufficient.

In the case of a mesa structure formed with a tapered structure having an inclined surface at a certain angle with respect to a (100)-flat plane of the top surface of a mesa as disclosed in Japanese Laid-open Patent Publication No. 2004-119563, the step density of the inclined surface of the mesa is originally fixed. Here, the inclined surface of the mesa is literally inclined in a macroscopic view, but, in a microscopic view, the inclined surface of the mesa is formed by stacking atomic layers stepwise on the flat (100)-plane, for example. The height of one of the steps might be equal to the height of one atomic layer (approximately 2.9 Å), or might be equal to the height of several atomic layers. The "step density" is the number of steps per unit height in the step-like portion. More specifically, as the number of atomic layers of each step is larger (as the height of each one step is larger), the step density is lower, and the inclined angle of the inclined surface is larger. When the inclined angle of the mesa inclined surface is fixed as in Japanese Laid-open Patent Publication No. 2004-119563, the number of atomic layers in each step is fixed, and the step density of the mesa inclined surface is also fixed. When crystals are regrown on the mesa inclined surface with the fixed step density, crystals at the shoulder portions of the mesa are easily formed in a new particular crystal plane orientation that is an intermediate plane orientation between the plane orientation of the crystals grown on the top portion of the mesa (a (100)-flat plane, for example) and the plane orientation of the crystals grown on the inclined surface of the mesa. The crystal growth rate in the new particular plane orientation is normally low. Therefore, the grown layer thickness at the shoulder portion of the mesa becomes smaller, and the covering properties at the portion tend to be insufficient.

Japanese Laid-open Patent Publication No. 2008-66329 also discloses a method for improving the covering properties of a regrown layer by performing a heat treatment after the growth. When such a heat treatment is additionally performed, however, the costs become higher due to the addition of the procedure, and the crystallinity might become poorer due to the heat treatment.

As described above, it is difficult to improve the mesa covering properties of the semiconductor layer regrown on the mesa, without an addition of any procedure.

According to the present invention, the sidewall of the mesa is a surface inclined in the direction in which the bottom of the mesa becomes wider, and the inclined angle of the inclined surface at the upper end portion of the mesa is smaller than the inclined angle of the inclined surface at the lower end portion of the mesa. Further, the sidewall that is the inclined surface of the mesa is covered with a semiconductor layer. With this arrangement, the covering properties of the semiconductor layer covering the sidewall of the mesa can be improved, without an addition of any special procedure. In other words, since the mesa including the light-absorbing layer does not include a reverse mesa portion or a mesa portion having an almost vertical sidewall, the semiconductor layer can thoroughly cover the sidewall. Particularly, when the mesa has a reverse mesa orientation (an orientation in which a reverse mesa is formed when etching is performed with the use of an etching mask originally having high adhesiveness), a reverse mesa structure or a mesa structure having an almost vertical sidewall is not formed. Accordingly, the mesa can be thoroughly covered with the semiconductor layer.

The reasons for the above are as follows. When the inclined angle at the upper end portion of the mesa is smaller than the inclined angle at the lower end portion, the "crystals in the particular new plane orientation" having a low crystal growth rate are more effectively prevented from being formed at the shoulder portion of the mesa, compared with the structure disclosed in Japanese Laid-open Patent Publication No. 2004-119563. Instead, crystals having same plane orientation as the crystals formed on the top surface (a (100)-flat plane, for example) of the mesa are easily formed at the shoulder portion of the mesa. Accordingly, a film that reflects the shape of the mesa observed before the growth of the semiconductor layer and has a relatively uniform film thickness is readily formed, and the covering properties of the semiconductor layer covering the mesa (particularly, the covering properties at the shoulder portion) are improved. Inclined surfaces of a mesa of various inclined angles can be formed by wet etching. However, a crystal plane orientation in which crystals are easily grown by vapor phase epitaxy (hereinafter referred to as the particular crystal plane orientation) is normally determined by the growth conditions, and the particular crystal plane orientation is not easily affected by the inclined angle of the base. More specifically, in the initial stage of the growth of the semiconductor layer covering the mesa, crystals are grown on the inclined surface of the base, but the growth rate varies among various locations on the inclined surface (the grown atoms are more vigorously taken at a step end or on a vertical surface of each step, than on a flat surface). Therefore, the average step density changes in the course of the growth, and an inclined surface different from the base inclined surface is formed. At last, the growth progresses on the growth surface in the particular crystal plane orientation in which vapor phase epitaxy is most easily performed. After that, the crystal growth in the particular crystal plane orientation continues. In the present invention, the inclined surface of the mesa has plural inclined angles. Therefore, the grown film thickness varies before the growth surface in the particular crystal plane orientation is formed on the base inclined surface, and the film thickness tends to be large until a uniform growth surface in the particular crystal plane orientation is formed on the entire inclined surface (a grown surface in the particular crystal plane orientation is formed on the base inclined surface at various angles until a uniform grown surface in the particular crystal plane orientation is formed on the entire inclined surface. However, the grown surface on the base inclined surface does not form one continuous crystal surface, since the grown film thicknesses on the base inclined surface at the respective angles are different from one another). As a result, the base crystal surface is readily prevented from being partially exposed.

As the covering properties of the semiconductor layer covering the sidewall of the mesa, variations of the characteristics (dark current, breakdown voltage, and the likes) of the mesa photodiode can be reduced, and long-term reliability can be secured.

Furthermore, in the present invention, the formation of a pn junction is completed when the layer stacking and growing are finished. Accordingly, the location of the pn junction and the electric field distribution can be easily controlled, and the results of the growth can be checked in some stage after the growth.

According to the present invention, the covering properties of a semiconductor layer covering a mesa can be improved, without an addition of any special procedure.

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Embodiments of the present invention will be explained below, referring to the attached drawings. Note that any similar constituents will be given the same reference numerals or symbols in all drawings, and explanations therefor will not be repeated.

[First Embodiment]

FIG. 1 is a cross-sectional view showing the structure of a mesa photodiode 100 according to a first embodiment.

The mesa photodiode 100 according to this embodiment has a stack structure formed on a semiconductor substrate (an n-type InP substrate 11, for example). The stack structure is formed by stacking and growing a buffer layer (an n-type semiconductor buffer layer 12, for example) made of a semiconductor of a first conductivity type, an etching stopper layer (an undoped InP etching stopper layer 13, for example) made of a semiconductor of the first conductivity type, a second conductivity type, or an undoped type, a light-absorbing layer (an undoped InGaAs light-absorbing layer 14, for example) made of a semiconductor of the first conductivity type, the second conductivity type, or the undoped type, and a double-layer semiconductor layer (a p-type InGaAs cap layer 15 and a p$^+$-type InGaAs contact layer 16, for example) of the second conductivity type in this order. The double-layer semiconductor layer (the p-type InGaAs cap layer 15 and the p$^+$-type InGaAs contact layer 16, for example) and the light-absorbing layer (the undoped InGaAs light-absorbing layer 14, for example) constitute a mesa (a light-receiving region mesa 19), and the sidewall of the mesa (the light-receiving region mesa 19) is a surface inclined in the direction in which the bottom of the mesa (the light-receiving region mesa 19) becomes wider. At least the sidewall 112 of the mesa (the light-receiving region mesa 19) is covered with a semiconductor layer (an undoped InP layer 17, for example) of the first conductivity type, the second conductivity type, a semi-insulating type, or the undoped type that is grown on the sidewall 112. The inclined angle ($\theta$3 of FIG. 1, for example) of the inclined surface at the upper end portion of the mesa (the light-receiving region mesa 19) is smaller than the inclined angle ($\theta$1 of FIG. 1, for example) of the inclined surface at the lower end portion of the mesa (the light-receiving region mesa 19).

A method for manufacturing a mesa photodiode according to this embodiment includes: a first step of forming a stack structure on a semiconductor substrate (the n-type InP substrate 11, for example), the stack structure being formed by stacking and growing a buffer layer (the n-type semiconductor buffer layer 12, for example) made of a semiconductor of a first conductivity type, an etching stopper layer (the undoped InP etching stopper layer 13, for example) made of a semiconductor of the first conductivity type, a second conductivity type, or an undoped type, a light-absorbing layer (the undoped InGaAs light-absorbing layer 14, for example) made of a semiconductor of the first conductivity type, the second conductivity type, or the undoped type, and a double-layer semiconductor layer (the p-type InGaAs cap layer 15 and the p$^+$-type InGaAs contact layer 16, for example) of the second conductivity type in this order; a second step of processing the double-layer semiconductor layer (the p-type InGaAs cap layer 15 and the p$^+$-type InGaAs contact layer 16, for example) and the light-absorbing layer (the undoped InGaAs light-absorbing layer 14, for example) into a mesa (the light-receiving region mesa 19); and a third step of covering at least the sidewall 112 of the mesa (the light-receiving region mesa 19) with a semiconductor layer (the undoped InP layer 17, for example) of the first conductivity type, the second conductivity type, a semi-insulating type, or the undoped type that is grown on the sidewall 112. In the second step, the sidewall 112 of the mesa (the light-receiving region mesa 19) is formed on a surface inclined in the direction in which the bottom of the mesa (the light-receiving region mesa 19) becomes wider, and the inclined angle ($\theta$3 of FIG. 1, for example) of the inclined surface at the upper end portion of the mesa (the light-receiving region mesa 19) is smaller than the inclined angle ($\theta$1 of FIG. 1, for example) of the inclined surface at the lower end portion of the mesa (the light-receiving region mesa 19).

The mesa photodiode is described below in greater detail.

First, the structure of the mesa photodiode 100 according to the first embodiment is described.

The mesa photodiode 100 according to this embodiment is a mesa PIN-PD (a mesa PIN photodiode). As shown in FIG. 1, the mesa photodiode 100 according to this embodiment includes the n-type InP substrate 11, and the n-type semiconductor buffer layer 12, the undoped InP etching stopper layer 13, the undoped InGaAs light-absorbing layer 14, the p-type InGaAs cap layer 15, and the p$^+$-type InGaAs contact layer 16 that are stacked and grown in this order on the n-type InP substrate 11 by MOVPE.

The undoped InGaAs light-absorbing layer 14, the p-type InGaAs cap layer 15, and the p$^+$-type InGaAs contact layer 16 are processed into a mesa shape, and form the light-receiving region mesa 19.

The sidewall 112 of the light-receiving region mesa 19 is a surface inclined in the direction in which the bottom of the light-receiving region mesa 19 becomes wider. More specifically, there is no overhanging portion, and the shape of this light-receiving region mesa 19 is a so-called "tapered mesa shape (forward mesa shape)". The light-receiving region mesa 19 seen in a plan view is round in shape, for example.

Here, the inclined angle of the inclined surface of the light-receiving region mesa 19 at the upper end portion is smaller than the inclined angle of the inclined surface of the light-receiving region mesa 19 at the lower end portion. More specifically, the inclined angle $\theta$3 of the inclined surface of the p+-type InGaAs contact layer 16 of the light-receiving region mesa 19 is smaller than the inclined angle $\theta$1 of the inclined surface of the undoped InGaAs light-absorbing layer 14 of the light-receiving region mesa 19.

In this embodiment, the inclined angle $\theta$2 of the inclined surface of the p-type InGaAs cap layer 15 of the light-receiving region mesa 19 is equal to the inclined angle $\theta$3, for example.

The sidewall 112 and the top surface 113 of the light-receiving region mesa 19 having the above shape are covered with the undoped InP layer 17 that is grown (regrown) on the sidewall 112 and the top surface 113.

A ring-like p-electrode 110 is provided on the top surface 113 of the light receiving region mesa 19 via a ring-like opening formed in the undoped InP layer 17.

The undoped InP layer 17 is covered with a surface passivation film 18 made of SiN, for example. Accordingly, the undoped InP layer 17 is covered with a dielectric film.

The bottom face of the n-type InP substrate 11 is polished so that the n-type InP substrate 11 has a desired thickness.

Further, an n-electrode 111 is formed below the polished bottom face of the n-type InP substrate.

Next, a method for manufacturing the mesa photodiode (a mesa PIN-PD) according to the first embodiment is described.

First, the n-type semiconductor buffer layer 12, the undoped InP etching stopper layer 13, the undoped InGaAs light-absorbing layer 14, the p-type InGaAs cap layer 15, and the p$^+$-type InGaAs contact layer 16 are stacked and grown in this order on the n-type InP substrate 11 by MOVPE.

The light-receiving region mesa 19 that is round in shape when seen in a plan view is then formed by etching with the use of the undoped InP etching stopper layer 13. More specifically, an etching mask is formed on the p$^+$-type InGaAs contact layer 16, and etching is performed on the undoped InGaAs light-absorbing layer 14, the p-type InGaAs cap layer 15, and the p$^+$-type InGaAs contact layer 16 (the etching will be hereinafter referred to as "mesa etching"). In this manner, the undoped InGaAs light-absorbing layer 14, the p-type InGaAs cap layer 15, and the p$^+$-type InGaAs contact layer 16 are processed into the light-receiving region mesa 19. The mesa etching may be wet etching or dry etching.

When the mesa etching is performed, the adhesion between the etching mask and the p$^+$-type InGaAs contact layer 16 is controlled. In this manner, the angle difference between the inclined angle $\theta 1$ of the inclined surface of the undoped InGaAs light-absorbing layer 14 of the light-receiving region mesa 19 and each of the inclined angles $\theta 2$ and $\theta 3$ of the inclined surfaces of the p-type InGaAs cap layer 15 and the p$^+$-type InGaAs contact layer 16 of the light-receiving region mesa 19 can be controlled.

Alternatively, the dopant density difference between the undoped InGaAs light-absorbing layer 14 and the p-type InGaAs cap layer 15 may be controlled in advance so that the angle difference between the inclined angle $\theta 1$ and each of the inclined angles $\theta 2$ and $\theta 3$ can be controlled.

More specifically, as the adhesion between the etching mask and the p$^+$-type InGaAs contact layer 16 is lowered, the side etching amount in the layer closer to the etching mask (the upper layer) becomes larger. Accordingly, the inclined angle of the layer closer to the etching mask can be made smaller than the angle of a certain crystalline orientation formed by chemical etching. In other words, the reduction in adhesion contributes to the formation of the light-receiving region mesa 19 in which the inclined angle $\theta 3$ is smaller than the inclined angle $\theta 1$.

The etching mask used in the mesa etching may be formed with a SiO$_2$ or SiN film, or may be formed with a photoresist, for example.

When the etching mask is formed with a SiO$_2$ or SiN film, the deposition conditions in CVD (Chemical Vapor Deposition) of the SiO$_2$ or SiN film are selected to control the adhesion between the etching mask and the p$^+$-type InGaAs contact layer 16. More specifically, as the SiO$_2$ or SiN film is deposited at a lower temperature, the surface activity of the deposited substance can be made lower. Accordingly, the adhesion between the etching mask and the p$^+$-type InGaAs contact layer 16 can be made lower.

When the etching mask is formed with a photoresist, the conditions in postbaking of the photoresist are selected to control the adhesion between the etching mask and the p$^+$-type InGaAs contact layer 16. More specifically, as the postbaking of the photoresist is performed at a lower temperature or in a shorter period of time, the hardness of the photoresist can be lowered. In this manner, the adhesion between the etching mask and the p$^+$-type InGaAs contact layer 16 can be lowered.

The etching rate of a semiconductor layer becomes higher as its dopant density becomes higher. Accordingly, the dopant density in the upper layer (the p-type InGaAs cap layer 15 and the p$^+$-type InGaAs contact layer 16 in this embodiment, for example) is made higher, and the dopant density in the lower layer (the undoped InGaAs light-absorbing layer 14 in this embodiment, for example) is made lower. In this manner, the side etching amount in the upper layer can be set larger than the side etching amount in the lower layer, and the inclined angle $\theta 3$ can be made smaller than the inclined angle $\theta 1$.

As described above, the light-receiving region mesa 19 in which the inclined angle $\theta 3$ is smaller than the inclined angle $\theta 1$ can be formed by controlling the adhesion between the etching mask and the p$^+$-type InGaAs contact layer 16, and controlling the dopant density difference between the undoped InGaAs light-absorbing layer 14 and the p-type InGaAs cap layer 15.

The undoped InP layer 17 is then grown (regrown) on the sidewall 112 and the top surface 113 of the light-receiving region mesa 19 by MOVPE. With this arrangement, the sidewall 112 and the top surface 113 of the light-receiving region mesa 19 are covered with the undoped InP layer 17 as an InP regrown layer with excellent covering properties.

To form the p-electrode 110 directly on the p$^+$-type InGaAs contact layer 16 of the light-receiving region mesa 19, a ring-like opening is formed at a desired location of the undoped InP layer 17 by selective etching. In doing so, an etching mask is formed on the undoped InP layer 17 by patterning with the use of a photoresist. Since the undoped InP layer 17 on the top surface 113 of the light-receiving region mesa 19 is flat, the exposure mask used for forming the etching mask and the undoped InP layer 17 can be prevented from interfere with each other when the etching mask is formed. Accordingly, the exposure mask and the undoped InP layer 17 can be placed at an appropriately shorter distance from each other, and sufficient precision can be secured in transferring a pattern on the photoresist. In this manner, sufficient precision of positioning the pattern of the etching mask or sufficient precision of positioning the p-electrode 110 can be secured.

The surface passivation film 18 is then formed with a SiN film or the like. After that, a hole is formed in the surface passivation film 18 at the portion corresponding to the above ring-like opening by a liftoff technique or the like that is generally used in semiconductor manufacturing processes. The p-electrode 110 is formed on the p$^+$-type InGaAs contact layer 16 via this hole.

The bottom face of the n-type InP substrate 11 is then polished, to process the n-type InP substrate 11 to have a desired thickness. The n-electrode 111 is then formed below the polished bottom face of the n-type InP substrate 11.

In the above manner, the mesa photodiode 100 according to the first embodiment can be manufactured.

According to the above first embodiment, the sidewall 112 of the light-receiving region mesa 19 is a surface inclined in the direction in which the bottom of the light-receiving region mesa 19 becomes wider (the sidewall 112 having no overhanging portions), and the inclined angle $\theta 3$ of the inclined surface at the upper end portion of the light-receiving region mesa 19 is smaller (gentler) than the inclined angle $\theta 1$ of the inclined surface at the lower end portion of the light-receiving region mesa 19. Further, the sidewall 112 that is the inclined surface of the light-receiving region mesa 19 is covered with a semiconductor layer, that is, the undoped InP layer 17. With this arrangement, the covering properties of the undoped InP layer 17 covering the sidewall 112 of the light-receiving region mesa 19 can be improved, without an addition of any special procedure. In other words, since the light-receiving region mesa 19 including the undoped InGaAs light-absorbing layer 14 does not include a reverse mesa portion or a mesa portion having an almost vertical sidewall, the undoped InP layer 17 can thoroughly cover the sidewall 112. Particularly, when the light-receiving region mesa 19 has a reverse mesa orientation (an orientation in which a reverse mesa is formed when etching is performed with the use of an etching mask originally having high adhesiveness), a reverse mesa structure or a mesa structure having an almost vertical sidewall is not formed. Accordingly, the light-receiving region mesa 19 can be thoroughly covered with the undoped InP layer 17.

The reasons for the above are as follows. First, as already mentioned in RELATED ART, in the case of a mesa structure having an inclined surface with a constant inclined angle as disclosed in Japanese Laid-open Patent Publication No. 2004-119563, when crystals are regrown on an inclined mesa surface, crystals at the shoulder portions of the mesa are easily formed in a particular crystal plane orientation that is an intermediate plane orientation between a crystal plane orientation in which crystals are grown on a (100)-flat plane at the top portion of the mesa, and a crystal plane orientation in which crystals are grown on the inclined mesa surface. Since the crystal growth rate in the new particular plane orientation is normally low, the covering properties of the shoulder portion of the mesa tend to become insufficient. On the other hand, when the inclined angle $\theta 3$ at the upper end portion is smaller than the inclined angle $\theta 1$ at the lower end portion as in the light-receiving region mesa 19 of this embodiment, the "crystals in the particular new plane orientation" having a low crystal growth rate are prevented from being formed at the shoulder portion of the light-receiving region mesa 19. Instead, crystals having same plane orientation as the crystals formed on the top surface (a (100)-flat plane, for example) of the light-receiving region mesa 19 are easily formed at the shoulder portion of the light-receiving region mesa 19. Accordingly, a film that reflects the shape of the light-receiving region mesa 19 observed before the regrowth and has a relatively uniform film thickness is readily formed, and the covering properties of the undoped InP layer 17 covering the light-receiving region mesa 19 (particularly, the covering properties at the shoulder portion) are improved.

The mechanism of the above is described below in greater detail. The inclined surface of a mesa of various inclined angles (a surface having various stepwise densities in a microscopic view) can be formed by wet etching. However, a crystal plane orientation in which crystals are readily grown by vapor phase epitaxy (hereinafter referred to as the particular crystal plane orientation) is normally determined by the growth conditions (a particular plane orientation having uniform step densities in a microscopic view is determined), and the particular crystal plane orientation is not easily affected by the inclined angle of the base (or is not easily affected by the step density of the base in a microscopic view). More specifically, in the initial stage of regrowth, crystals are grown on the inclined surface of the base, but the growth rate varies among various locations on the inclined surface (the grown atoms are more vigorously taken at a step end or on a vertical surface of each step, than on a flat surface). Therefore, the average step density changes in the course of the growth, and an inclined surface (an intermediate inclined surface) different from the base inclined surface is formed (the region formed in the regrown film in this stage is called a transition region). At last, the growth progresses on the growth surface in the particular crystal plane orientation in which vapor phase epitaxy is most easily performed. After that, the crystal growth in the particular crystal plane orientation continues. In this embodiment, the base inclined surface has various inclined angles (two inclined angles, for example). Therefore, the grown film thickness varies before the growth surface in the particular crystal plane orientation is formed on the base inclined surface, and the film thickness tends to be large until a uniform growth surface in the particular crystal plane orientation is formed on the entire inclined surface (a grown surface in the particular crystal plane orientation is formed on the base inclined surface at the respective angles until a uniform grown surface in the particular crystal plane orientation is formed on the entire inclined surface. However, the grown surface on the base inclined surface does not form one continuous crystal surface, since the grown film thicknesses on the base inclined surface at the respective angles are different from one another). As a result, the base crystal surface is readily prevented from being partially exposed.

As the covering properties of the undoped InP layer 17 covering the sidewall 112 of the light-receiving region mesa 19, variations of the characteristics (dark current, breakdown voltage, and the likes) of the mesa photodiode 100 can be reduced, and long-term reliability can be secured. This is because a depletion layer of the light-absorbing layer (the undoped InGaAs light-absorbing layer 14 (a semiconductor with a small bandgap), for example) that causes variations in the dark current characteristics and the long service life of the mesa photodiode 100 can be prevented from being exposed through the surface, and the semiconductor in contact with the dielectric film (the surface passivation film 18) formed thereon can be the undoped InP layer 17 with wide-gap. The mesa photodiode 100 having this structure has the advantages of being readily manufactured and being able to obtain gigabit response characteristics with high reliability. The mesa photodiode 100 having this structure can be suitably used in the next-generation subscriber optical communication systems or data communication systems.

After the undoped InP layer 17 is grown on the sidewall 112 and the top surface 113 of the light-receiving region mesa 19, the p-electrode 110 is formed on the top surface 113 of the light-receiving region mesa 19. After that, the undoped InP layer 17 is left at least on the sidewall 112. With this arrangement, sufficiently high accuracy can be secured for the location of formation of the p-electrode 110. In the structure disclosed in Japanese Laid-open Patent Publication No. 2004-119563, a mesa is buried through selective growth. In this structure, however, a buried layer formed higher than the top portion of the mesa might adversely affect the electrode pattern forming procedure to be carried out after the growth of the buried layer. For example, to form an electrode pattern on the top portion of a mesa, an opening is formed in the passivation film with the use of an etching mask formed by patterning with a photoresist. In doing so, the precision of pattern transfer onto the photoresist becomes lower unless the distance between an exposure mask and the top portion of the mesa can be shortened enough due to the buried layer interfering with the exposure mask. As a result, the location precision of the pattern of the etching mask or the location precision of the electrode formation becomes lower. To counter this problem in this embodiment, the undoped InP layer 17 is regrown on the sidewall 112 and the top surface 113 of the light-receiving region mesa 19, so that the flatness of the undoped InP layer 17 on the top surface 113 is maintained after the regrowth. Accordingly, the exposure mask used in forming the etching mask for forming the p-electrode 110 and the undoped InP layer 17 can be prevented from interfering with each other. In this manner, the distance between the exposure mask and the undoped InP layer 17 can be readily shortened to an appropriate distance, and sufficient precision of pattern transfer onto the photoresist can be secured. Thus, sufficiently high location precision of the pattern of the etching mask or sufficiently high location precision of the formation of the p-electrode 110 can be secured.

Furthermore, in this embodiment, the formation of a pn junction is completed by stacking and growing the n-type semiconductor buffer layer 12, the undoped InP etching stopper layer 13, the undoped InGaAs light-absorbing layer 14, the p-type InGaAs cap layer 15, and the p$^+$-type InGaAs contact layer 16 in this order by MOVPE. Accordingly, the location of the pn junction and the electric field distribution can be easily controlled, and the results of the growth can be checked in some stage after the growth.

Next, Example 1 is described. Example 1 is an example of the first embodiment.

In Example 1, the film thickness of the n-type semiconductor buffer layer 12 is approximately 1 μm, the film thickness of the undoped InP etching stopper layer 13 is approximately 20 to 100 nm, the film thickness of the undoped InGaAs light-absorbing layer 14 is approximately 2 μm, the film thickness of the p-type InGaAs cap layer 15 is approximately 0.2 μm, and the film thickness of the p$^+$-type InGaAs contact layer 16 is approximately 0.2 μm. The diameter of the light-receiving region mesa 19 is approximately 50 to 80 μm. In the bottom-face polishing performed on the bottom face of the n-type InP substrate 11 after the formation of the p-electrode 110, the polishing is performed so that the n-type InP substrate 11 has a thickness of approximately 150 μm.

In the mesa photodiode 100 manufactured according to Example 1, the dark current obtained when a bias voltage of 5 V is applied is a low dark current of approximately 1 nA or less. Also, GHz response characteristics are confirmed, and the temporal stability of the dark current is confirmed to have highly reliable characteristics without an increase in dark current even after 5,000 hours in aging at 150° C.

[Second Embodiment]

Figure 2:
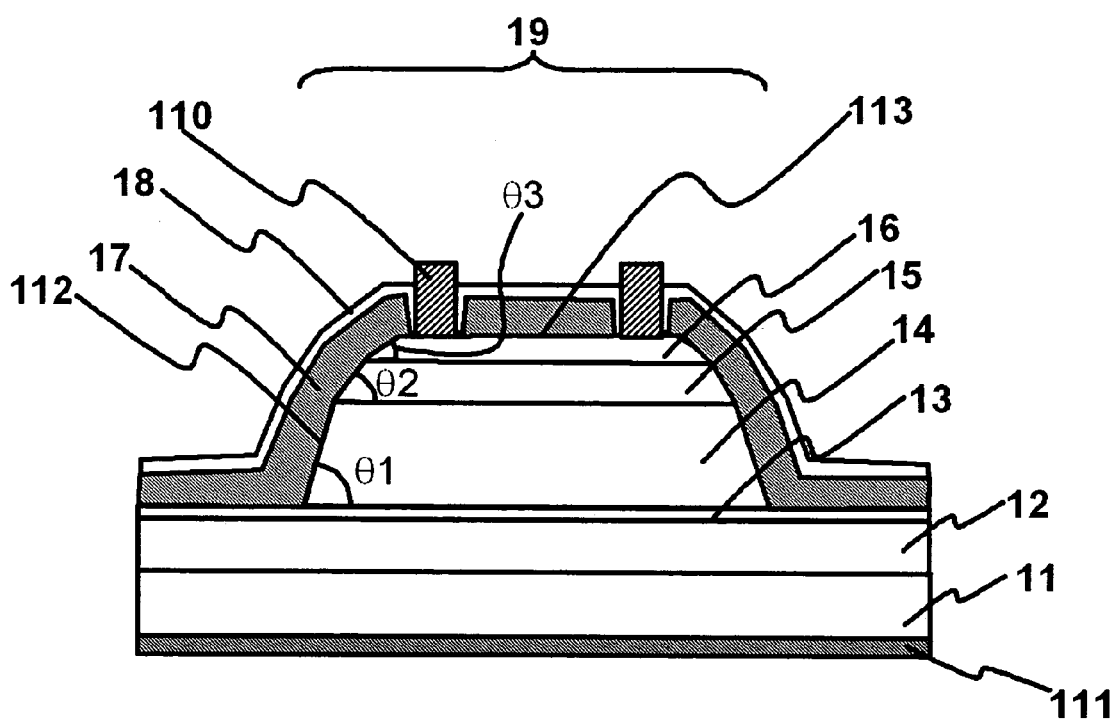
FIG. 2 is a cross-sectional view showing the structure of a mesa photodiode (a mesa PIN photodiode) according to a second embodiment.

FIG. 2 is a cross-sectional view showing the structure of a mesa photodiode (a mesa PIN-PD) 200 according to a second embodiment.

As shown in FIG. 2, the mesa photodiode 200 according to this embodiment differs from the mesa photodiode 100 according to the first embodiment only in that the inclined angle θ3 is smaller than the inclined angle θ2. The other aspects of the mesa photodiode 200 are the same as those of the mesa photodiode 100 according to the above first embodiment.

More specifically, in this embodiment, the inclined angle θ2 of the inclined surface of the p-type InGaAs cap layer 15 forming the light-receiving region mesa 19 is smaller than the inclined angle θ1 of the inclined surface of the undoped InGaAs light-receiving layer 14 forming the light-receiving region mesa 19. The inclined angle θ3 of the inclined surface of the p$^+$-type InGaAs contact layer 16 forming the light-receiving region mesa 19 is even smaller than the inclined angle θ2. In other words, the inclined angle of the inclined surface of the light-receiving region mesa 19 becomes gradually smaller in the direction from the lower end to the upper end of the light-receiving region mesa 19. More specifically, the inclined angle of the inclined surface of the light-receiving region mesa 19 becomes smaller stepwise in the direction from the lower end to the upper end of the light-receiving region mesa 19.

The structure in which the inclined angle θ3 is smaller than the inclined angle θ2 can be realized by controlling the adhesion between the etching mask and the p$^+$-type InGaAs contact layer 16 at the time of mesa etching. More specifically, the adhesion between the etching mask and the p$^+$-type InGaAs contact layer 16 is made lower than in the first embodiment, so that the light-receiving region mesa 19 in which the inclined angle θ3 is smaller than the inclined angle θ2 can be formed. Alternatively, the dopant density difference between the p$^+$-type InGaAs contact layer 16 and the p-type InGaAs cap layer 15 is set larger than in the first embodiment, so that the light-receiving region mesa 19 in which the inclined angle θ3 is smaller than the inclined angle θ2 can be formed.

According to the above second embodiment, the same effects as those of the first embodiment can be achieved.

Next, Example 2 is described. Example 2 is an example of the second embodiment.

In Example 2, the film thickness of the n-type semiconductor buffer layer 12 is approximately 1 μm, the film thickness of the undoped InP etching stopper layer 13 is approximately 20 to 100 nm, the film thickness of the undoped InGaAs light-absorbing layer 14 is approximately 2 μm, the film thickness of the p-type InGaAs cap layer 15 is approximately 0.2 μm, and the film thickness of the p$^+$-type InGaAs contact layer 16 is approximately 0.2 μm. The diameter of the light-receiving region mesa 19 is approximately 50 to 80 μm. In the bottom-face polishing performed on the bottom face of the n-type InP substrate 11 after the formation of the p-electrode 110, the polishing is performed so that the n-type InP substrate 11 has a thickness of approximately 150 μm.

In the mesa photodiode 200 manufactured according to Example 2, the dark current obtained when a bias voltage of 5 V is applied is a low dark current of approximately 1 nA or less. Also, GHz response characteristics are confirmed, and the temporal stability of the dark current is confirmed to have highly reliable characteristics without an increase in dark current even after 5,000 hours in aging at 150° C.

[Third Embodiment]

Figure 3:
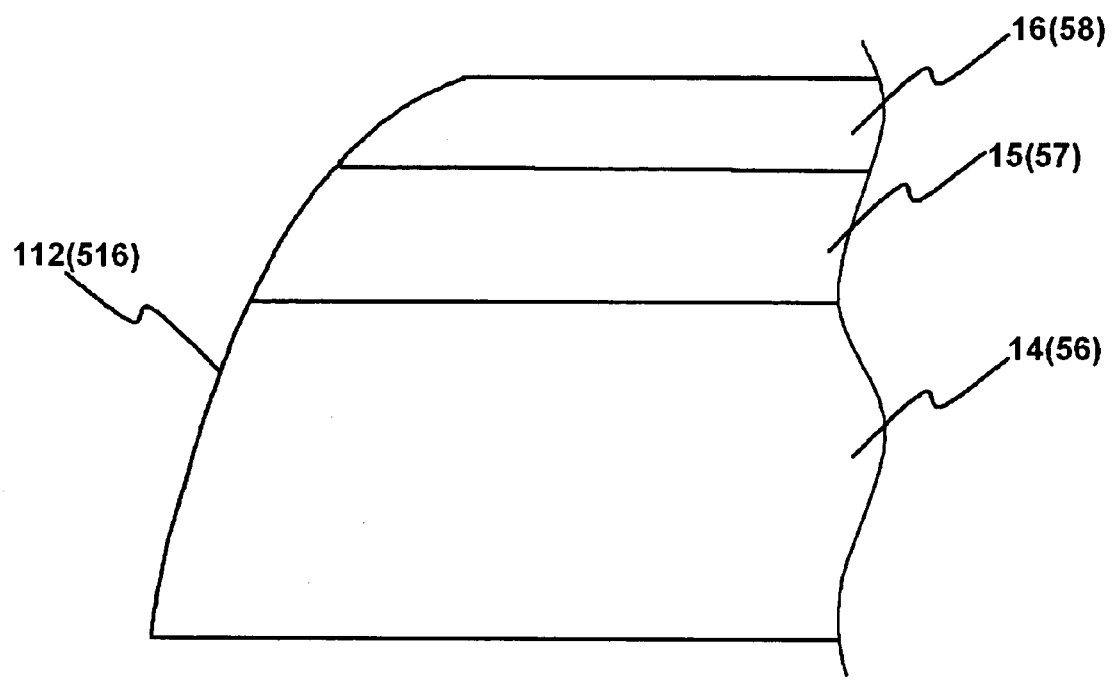
FIG. 3 is an enlarged cross-sectional view of each of a mesa photodiode (a mesa PIN photodiode) according to a third embodiment and a mesa photodiode (a mesa avalanche photodiode) according to a seventh embodiment.

FIG. 3 is an enlarged cross-sectional view of part of the light-receiving region mesa 19 of a mesa photodiode (a mesa PIN-PD, the entire view of which is not provided) according to a third embodiment.

The mesa photodiode according to this embodiment differs from the mesa photodiode 200 according to the second embodiment only in that the inclined angle of the inclined surface of the sidewall 112 of the light-receiving region mesa 19 becomes continuously smaller in the direction from the lower end to the upper end of the light-receiving region mesa 19. The other aspects of this mesa photodiode are the same as those of the mesa photodiode 200 according to the above second embodiment.

The structure in which the inclined angle of the inclined surface of the sidewall 112 of the light-receiving region mesa 19 becomes continuously smaller in the direction from the lower end to the upper end of the light-receiving region mesa 19 can be realized by continuously increasing the dopant density in the undoped InGaAs light-absorbing layer 14, the p-type InGaAs cap layer 15, and the p$^+$-type InGaAs contact layer 16 forming the light-receiving region mesa 19, in the direction from the lower end to the upper end of the light-receiving region mesa 19, for example.

According to the above third embodiment, the same effects as those of the second embodiment can be achieved.

[Fourth Embodiment]

Figure 4:
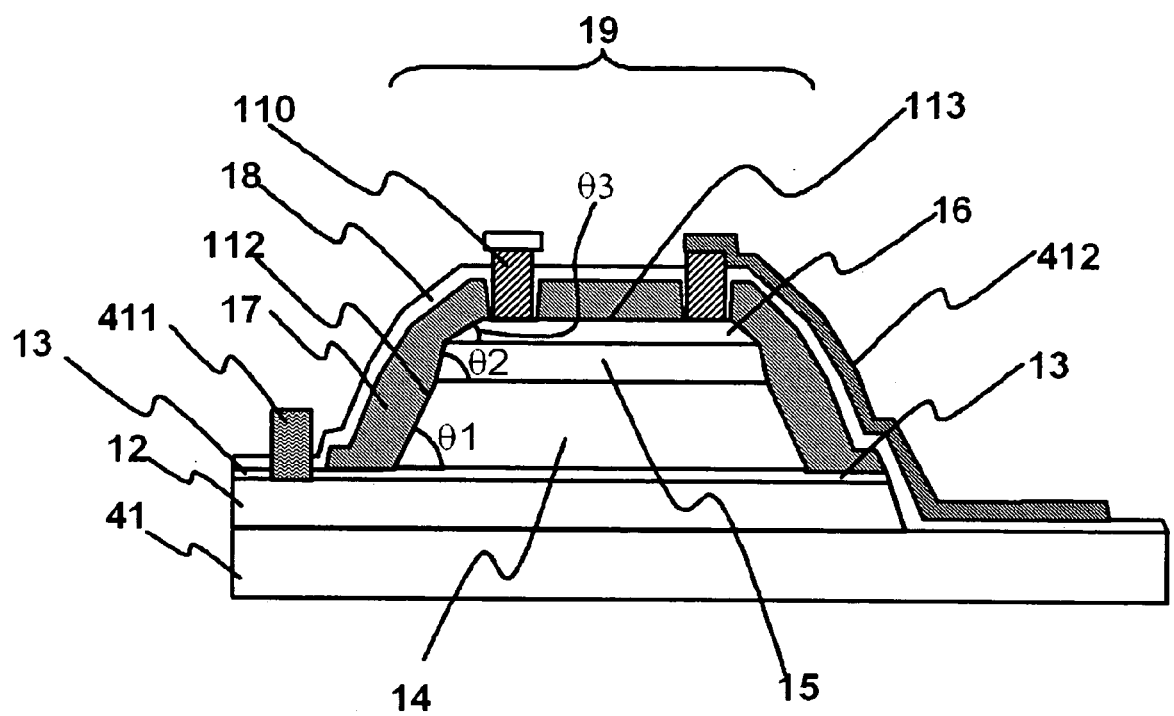
FIG. 4 is a cross-sectional view showing the structure of a mesa photodiode (a mesa PIN photodiode) according to a fourth embodiment.

FIG. 4 is a cross-sectional view showing the structure of a mesa photodiode (a mesa PIN-PD) 400 according to a fourth embodiment.

First, the structure of the mesa photodiode 400 according to the fourth embodiment is described.

As shown in FIG. 4, the mesa photodiode 400 according to this embodiment differs from the mesa photodiode 100 according to the first embodiment in that the inclined angle θ2 is larger than the inclined angle θ1.

The structure in which the inclined angle θ2 is larger than the inclined angle θ1 can be realized by controlling the dopant density difference between the undoped InGaAs light-absorbing layer 14 and the p-type InGaAs cap layer 15, for example. More specifically, this structure can be realized by setting the dopant density in the p-type InGaAs cap layer 15 is lower than that in the first embodiment, for example.

The mesa photodiode 400 according to this embodiment further differs from the mesa photodiode 100 according to the first embodiment in the following aspects.

First, the semiconductor substrate of the mesa photodiode 400 according to this embodiment is a high-resistance InP substrate (semi-insulating InP substrate) 41, for example. The n-type semiconductor buffer layer 12, the undoped InP etching stopper layer 13, the undoped InGaAs light-absorbing layer 14, the p-type InGaAs cap layer 15, and the p$^+$-type InGaAs contact layer 16 are stacked and grown in this order on the high-resistance InP substrate 41.

In this embodiment, an n-electrode 411 is not formed under the bottom face of the high-resistance InP substrate 41, but is formed on the n-type semiconductor buffer layer 12. To form the n-electrode 411 directly on the n-type semiconductor buffer layer 12, the desired portions of the undoped InP etching stopper layer 13 and the undoped InP layer 17 on the n-type semiconductor buffer layer 12 are removed by selective etching.

In this embodiment, the mesa photodiode 400 further includes an interconnection electrode over step-structure 412. This interconnection electrode over step-structure 412 has one end portion connected to the p-electrode 110. In the region that surrounds the light-receiving region mesa 19 and accommodates the interconnection electrode over step-structure 412, the n-type semiconductor buffer layer 12, the undoped InP etching stopper layer 13, and the undoped InP layer 17 are removed by selective etching. Accordingly, in this region, the n-type semiconductor buffer layer 12, the undoped InP etching stopper layer 13, and the undoped InP layer 17 are not interposed between the high-resistance InP substrate 41 and the interconnection electrode over step-structure 412.

The other aspects of the mesa photodiode 400 according to this embodiment are the same as those of the mesa photodiode 100 according to the above first embodiment.

Next, a method for manufacturing the mesa photodiode (a mesa PIN-PD) according to the fourth embodiment is described.

First, the n-type semiconductor buffer layer 12, the undoped InP etching stopper layer 13, the undoped InGaAs light-absorbing layer 14, the p-type InGaAs cap layer 15, and the p$^+$-type InGaAs contact layer 16 are stacked and grown in this order on the high-resistance InP substrate 41 by MOVPE.

The light-receiving region mesa 19 that is round in shape when seen in a plan view is then formed by mesa etching. In this embodiment, the dopant density difference between the undoped InGaAs light-absorbing layer 14 and the p-type InGaAs cap layer 15 is controlled by setting the dopant density in the p-type InGaAs cap layer 15 at a smaller value. In this manner, the structure in which the inclined angle θ2 is larger than the inclined angle θ1 is realized.

The undoped InP layer 17 is then regrown on the sidewall 112 and the top surface 113 of the light-receiving region mesa 19 by MOVPE. With this arrangement, the sidewall 112 and the top surface 113 of the light-receiving region mesa 19 are covered with the undoped InP layer 17 as an InP regrown layer with excellent covering properties.

To form the p-electrode 110 directly on the p$^+$-type InGaAs contact layer 16 of the light-receiving region mesa 19, a ring-like opening is formed at the desired portion of the undoped InP layer 17 by selective etching.

To form the n-electrode 411 directly on the n-type semiconductor buffer layer 12, the desired portions of the undoped InP etching stopper layer 13 and the undoped InP layer 17 on the n-type semiconductor buffer layer 12 are removed by selective etching.

The n-type semiconductor buffer layer 12, the undoped InP etching stopper layer 13, and the undoped InP layer 17 in the region that surrounds the light-receiving region mesa 19 and is to accommodate the interconnection electrode over step-structure 412 are removed by selective etching, to expose the high-resistance InP substrate 41.

The surface passivation film 18 formed with a SiN film or the like is then formed. After that, a hole is formed in the surface passivation film 18 at the portion corresponding to the above ring-like opening by a liftoff technique or the like that is generally used in semiconductor manufacturing processes. The p-electrode 110 is formed on the p$^+$-type InGaAs contact layer 16 via this hole. By the same technique as the technique for forming the p-electrode 110, the n-electrode 411 is formed on the n-type semiconductor buffer layer 12. The interconnection electrode over step-structure 412 is formed by TiPtAu deposition and milling, for example.

The bottom face of the high-resistance InP substrate 41 is then polished, so that the high-resistance InP substrate 41 has a desired thickness.

In the above manner, the mesa photodiode 400 according to the fourth embodiment can be manufactured.

According to the above fourth embodiment, the same effects as those of the first embodiment can be achieved.

Next, Example 3 is described. Example 3 is an example of the fourth embodiment.

In Example 3, the film thickness of the n-type semiconductor buffer layer 12 is approximately 1 μm, the film thickness of the undoped InP etching stopper layer 13 is approximately 20 to 100 nm, the film thickness of the undoped InGaAs light-absorbing layer 14 is approximately 2 μm, the film thickness of the p-type InGaAs cap layer 15 is approximately 0.2 μm, and the film thickness of the p$^+$-type InGaAs contact layer 16 is approximately 0.2 μm. The diameter of the light-receiving region mesa 19 is approximately 50 to 80 μm. In the bottom-face polishing performed on the bottom face of the high-resistance InP substrate 41 after the formation of the p-electrode 110 and the n-electrode 411, the polishing is performed so that the high-resistance InP substrate 41 has a thickness of approximately 150 μm.

In the mesa photodiode 400 manufactured according to Example 3, the dark current obtained when a bias voltage of 5 V is applied is a low dark current of approximately 1 nA or less. Also, response characteristics of GHz to several tens of GHz are confirmed, and the temporal stability of the dark current is confirmed to have highly-reliable characteristics without an increase in dark current even after 5,000 hours in aging at 150° C.

[Fifth Embodiment]

Figure 5:
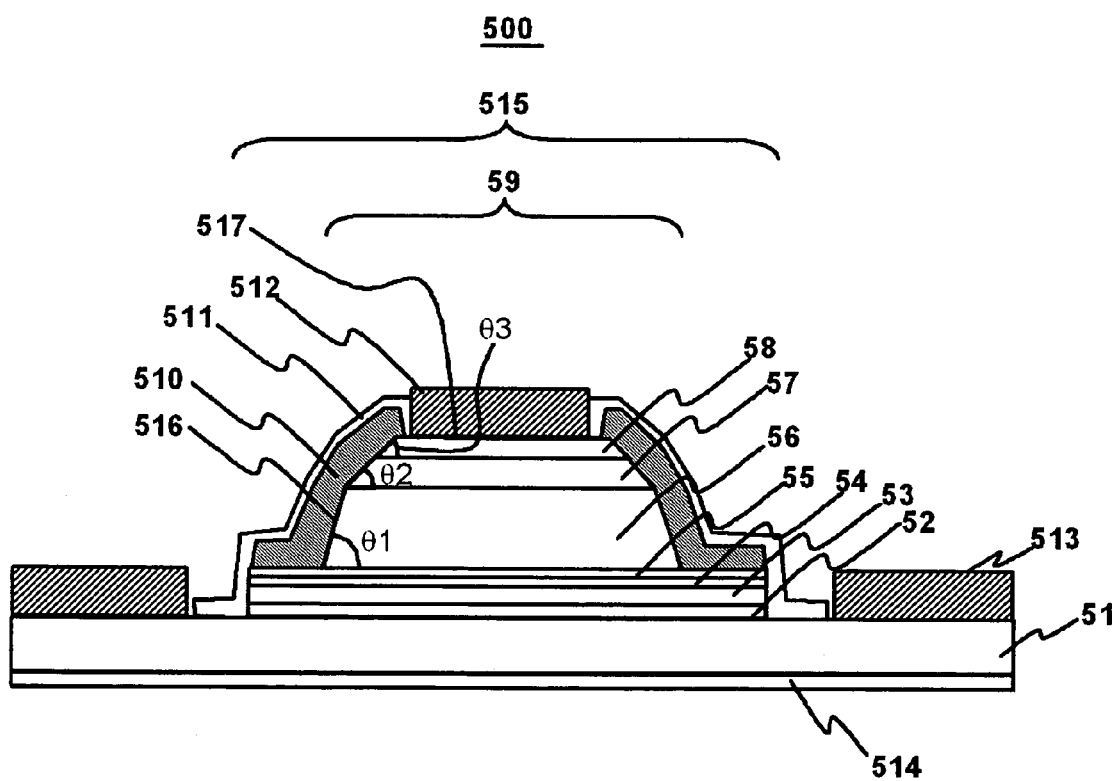
FIG. 5 is a cross-sectional view showing the structure of a mesa photodiode (a mesa avalanche photodiode) according to a fifth embodiment.

FIG. 5 is a cross-sectional view showing the structure of a mesa photodiode 500 according to a fifth embodiment.

First, the structure of the mesa photodiode 500 according to the fifth embodiment is described.

The mesa photodiode 500 according to this embodiment is a mesa APD (Avalanche PhotoDiode) of a back-side illuminated type.

As shown in FIG. 5, the mesa photodiode 500 according to this embodiment includes an n-type InP substrate 51, and an n-type semiconductor buffer layer 52, an undoped InAlAs multiplication layer 53, a p-type InAlAs field buffer layer 54, a p-type InP etching stopper layer 55, a p$^-$-type InGaAs light-absorbing layer 56, a p-type InGaAs cap layer 57, and a p$^+$-type InGaAs contact layer 58 that are stacked and grown in this order on the n-type InP substrate 51 by gas source MBE (Molecular Beam Epitaxy).

The p$^-$-type InGaAs light-absorbing layer 56, the p-type InGaAs cap layer 57, and the p$^+$-type InGaAs contact layer 58 are processed into a mesa shape, and constitute a light-receiving region mesa 59. The sidewall 516 of the light-receiving region mesa 59 is an inclined surface that is downwardly inclined in the direction toward the bottom of the light-receiving region mesa 59. The light-receiving region mesa 59 is round in shape when seen in a plan view.

The shape of the light-receiving region mesa 59 of this embodiment is the same as the shape of the light-receiving region mesa 19 of the first embodiment. More specifically, in this embodiment, the inclined angle of the inclined surface at the upper end portion of the light-receiving region mesa 59 is smaller than the inclined angle of the inclined surface at the lower end portion of the light-receiving region mesa 59. The inclined angle θ3 of the inclined surface of the p$^+$-type InGaAs contact layer 58 of the light-receiving region mesa 59 is smaller than the inclined angle θ1 of the inclined surface of the p$^-$-type InGaAs light-absorbing layer 56 of the light-receiving region mesa 59. The inclined angle θ2 of the inclined surface of the p-type InGaAs cap layer 57 of the light-receiving region mesa 59 is equal to the inclined angle θ3, for example.

At least the sidewall 516 of the light-receiving region mesa 59 having the above structure is covered with an undoped InP layer 510 formed thereon.

The outer peripheral portions of the undoped InP layer 510, the p-type InP etching stopper layer 55, the p-type InAlAs field buffer layer 54, the undoped InAlAs multiplication layer 53, and the n-type semiconductor buffer layer 52 are removed, so as to leave the portions of those layers existing inside a concentric circle of the light-receiving region mesa 59. The concentric circle is larger than the light-receiving region mesa 59. With this arrangement, a second mesa 515 is formed. The second mesa 515 includes the portions of the undoped InP layer 510, the p-type InP etching stopper layer 55, the p-type InAlAs field buffer layer 54, the undoped InAlAs multiplication layer 53, and the n-type semiconductor buffer layer 52 inside the above concentric circle, and the light-receiving region mesa 59.

The sidewall of the second mesa 515 including the undoped InP layer 510 is covered with a surface passivation film 511 made of SiN, for example.

Around p-electrode 512 is provided on the top surface 517 of the light-receiving region mesa 59 via a round opening that is formed in the undoped InP layer 510.

An n-electrode 513 is formed on the portion surrounding the above concentric circle on the surface of the n-type InP substrate 51.

The bottom face of the n-type InP substrate 51 is polished so that the n-type InP substrate 51 has a desired thickness. Furthermore, an AR coat 514 is formed under the polished bottom face of the n-type InP substrate 51.

Next, a method for manufacturing the mesa photodiode (a mesa APD of a back-side illuminated type) according to the fifth embodiment is described.

First, the n-type semiconductor buffer layer 52, the undoped InAlAs multiplication layer 53, the p-type InAlAs field buffer layer 54, the p-type InP etching stopper layer 55, the p$^-$-type InGaAs light-absorbing layer 56, the p-type InGaAs cap layer 57, and the p$^+$-type InGaAs contact layer 58 are stacked and grown in this order on the n-type InP substrate 51 by gas source MBE.

The light-receiving region mesa 59 that is round in shape when seen in a plan view is then formed by etching with the use of the p-type InP etching stopper layer 55. More specifically, an etching mask is formed on the p$^+$-type InGaAs contact layer 58, and mesa etching is performed on the p$^-$-type InGaAs light-absorbing layer 56, the p-type InGaAs cap layer 57, and the p$^+$-type InGaAs contact layer 58. By doing so, the p$^-$-type InGaAs light-absorbing layer 56, the p-type InGaAs cap layer 57, and the p$^+$-type InGaAs contact layer 58 are processed into the light-receiving region mesa 59. The mesa etching may be wet etching or dry etching. The etching mask used in the mesa etching may be formed with a SiO$_2$ or SiN film, or may be formed with a photoresist, as in the first embodiment.

In the mesa etching, the angle difference between the inclined angle θ1 of the inclined surface of the p$^-$-type InGaAs light-absorbing layer 56 of the light-receiving region mesa 59 and each of the inclined angles θ2 and θ3 of the inclined surfaces of the p-type InGaAs cap layer 57 and the p$^+$-type InGaAs contact layer 58 of the light-receiving region mesa 59 can be controlled by the same technique as in the first embodiment. More specifically, the angle difference between the inclined angle θ1 and each of the inclined angles θ2 and θ3 can be controlled by controlling the adhesion between the etching mask and the p$^+$-type InGaAs contact layer 58 or controlling the dopant density difference between the p$^-$-type InGaAs light-absorbing layer 56 and the p-type InGaAs cap layer 57.

The undoped InP layer 510 is then regrown on the sidewall 516 and the top surface 517 of the light-receiving region mesa 59 by MOVPE. With this arrangement, at least the sidewall 516 of the light-receiving region mesa 59 is covered with the undoped InP layer 510 as an InP regrown layer with excellent covering properties.

To form the p-electrode 512 on the p$^+$-type InGaAs contact layer 58 of the light-receiving region mesa 59, a round opening is then formed at the desired portion of the undoped InP layer 510 by selective etching.

The outer peripheral portions of the undoped InP layer 510, the p-type InP etching stopper layer 55, the p-type InAlAs field buffer layer 54, the undoped InAlAs multiplication layer 53, and the n-type semiconductor buffer layer 52 are removed, so as to leave the portions of those layers existing inside a concentric circle of the light-receiving region mesa 59 larger than the light-receiving mesa 59. The etching mask used in this selective etching may be formed with a SiO$_2$ or SiN film, or may be formed with a photoresist, for example. Through this selective etching, the second mesa 515 is formed.

The surface passivation film 511 formed with a SiN film or the like is then formed. After that, a hole is formed in the surface passivation film 511 at the portion corresponding to the above round opening by a liftoff technique or the like that is generally used in semiconductor manufacturing processes. The p-electrode 512 is formed on the p$^+$-type InGaAs contact layer 58 via this hole. The n-electrode 513 is further formed on the portion surrounding the above mentioned concentric circle on the surface of the n-type InP substrate 51.

The thickness of the n-type InP substrate 51 is adjusted to a desired thickness by polishing the bottom face of the n-type InP substrate 51, and mirror polishing is also performed on the bottom face of the n-type InP substrate 51. The AR coat 514 is then formed on the polished bottom face of the n-type InP substrate 51.

In the above manner, the mesa photodiode 500 according to the fifth embodiment can be manufactured.

According to the above fifth embodiment, the sidewall 516 of the light-receiving region mesa 59 is a surface inclined in the direction in which the bottom of the light-receiving region mesa 59 becomes wider (the sidewall 516 having no overhanging portions), and the inclined angle θ3 of the inclined surface at the upper end portion of the light-receiving region mesa 59 is smaller (gentler) than the inclined angle θ1 of the inclined surface at the lower end portion of the light-receiving region mesa 59. Further, the sidewall 516 that is the inclined surface of the light-receiving region mesa 59 is covered with a semiconductor layer, that is, the undoped InP layer 510. With this arrangement, the covering properties of the undoped InP layer 510 covering the sidewall 516 of the light-receiving region mesa 59 can be improved, without an addition of any special procedure.

As the covering properties of the undoped InP layer 510 covering the sidewall 516 of the light-receiving region mesa 59, variations of the characteristics (dark current, breakdown voltage, and the likes) of the mesa photodiode 500 can be reduced, and long-term reliability can be secured. This is because a depletion layer of the light-absorbing layer (the p⁻-type InGaAs light-absorbing layer 56 (a semiconductor with a small bandgap), for example) that causes variations in the dark current characteristics and the long service life of the mesa photodiode 100 can be prevented from being exposed through the surface, and the semiconductor in contact with the dielectric film (the surface passivation film 511) formed thereon can be the undoped InP layer 510 with wide-gap. The mesa photodiode 500 having this structure has the advantages of being readily manufactured and being able to obtain gigabit response characteristics with high reliability. The mesa photodiode 500 having this structure can be suitably used in the next-generation subscriber optical communication systems or data communication systems.

After the undoped InP layer 510 is grown on the sidewall 516 and the top surface 517 of the light-receiving region mesa 59, the p-electrode 512 is formed on the top surface 517 of the light-receiving region mesa 59. After that, the undoped InP layer 510 is left at least on the sidewall 516. With this arrangement, sufficiently high location precision of the formation of the p-electrode 512 can be secured. In the structure disclosed in Japanese Laid-open Patent Publication No. 2004-119563, a mesa is buried through selective growth. In this structure, however, the electrode pattern forming procedure to be carried out after the growth of the buried layer might be adversely affected, and the location precision of the electrode formation might become lower. In this embodiment, on the other hand, the undoped InP layer 510 is regrown on the sidewall 516 and the top surface 517 of the light-receiving region mesa 59, so that the flatness of the undoped InP layer 510 on the top surface 517 is maintained after the regrowth. Accordingly, the exposure mask used in forming the etching mask for forming the p-electrode 512 and the undoped InP layer 510 can be prevented from interfering with each other. In this manner, the distance between the exposure mask and the undoped InP layer 510 can be readily shortened to an appropriate distance, and sufficient precision of pattern transfer onto the photoresist can be secured. Thus, sufficiently high location precision of the pattern of the etching mask or sufficiently high location precision of the formation of the p-electrode 512 can be secured.

Furthermore, in this embodiment, the formation of a pn junction is completed by stacking and growing the n-type semiconductor buffer layer 52, the undoped InAlAs multiplication layer 53, the p-type InAlAs field buffer layer 54, the p-type InP etching stopper layer 55, the p⁻-type InGaAs light-absorbing layer 56, the p-type InGaAs cap layer 57, and the p⁺-type InGaAs contact layer 58 in this order by gas source MBE. Accordingly, the location of the pn junction and the electric field distribution can be easily controlled, and the results of the growth can be checked in some stage after the growth.

Furthermore, since the mesa photodiode 500 according to this embodiment is a mesa device structure, an electric field concentration due to a variation of the field adjustment amount (particularly, a high breakdown voltage Vbr) hardly occurs at the outer peripheral portion of the light-receiving region, even though the mesa photodiode 500 does not have a guard ring. Accordingly, uniform in-plane intensification characteristics can be obtained with excellent reproducibility.

Next, Example 4 is described. Example 4 is an example of the fifth embodiment.

In Example 4, the film thickness of the n-type semiconductor buffer layer 52 is approximately 1 μm, the film thickness of the undoped InAlAs multiplication layer 53 is 0.2 to 0.3 μm, the film thickness of the p-type InAlAs field buffer layer 54 is 20 to 100 nm, the film thickness of the p-type InP etching stopper layer 55 is 20 to 100 nm, the film thickness of the p⁻-type InGaAs light-absorbing layer 56 is 0.5 to 2 μm, the film thickness of the p-type InGaAs cap layer 57 is approximately 0.2 μm, and the film thickness of the p⁺-type InGaAs contact layer 58 is approximately 0.2 μm. The diameter of the light-receiving region mesa 59 is approximately 30 to 50 μm. In the bottom-face polishing performed on the bottom face of the n-type InP substrate 51 after the formation of the p-electrode 512 and the n-electrode 513, the polishing is performed so that the n-type InP substrate 51 has a thickness of approximately 150 μm.

In the mesa photodiode 500 manufactured according to Example 4, the breakdown voltage Vbr (being defined with the dark current as 10 μA) is 20 to 45 V, and the dark current obtained when a bias voltage of 0.9 Vbr (The "0.9 Vbr" means a bias voltage of 0.9 times of the breakdown voltage) is applied is a low dark current of approximately 40 nA or less. Also, GHz response characteristics are confirmed, and the temporal stability of the dark current is confirmed to have highly reliable characteristics without an increase in dark current even after 5,000 hours in aging at 150° C.

[Sixth Embodiment]

Figure 6:
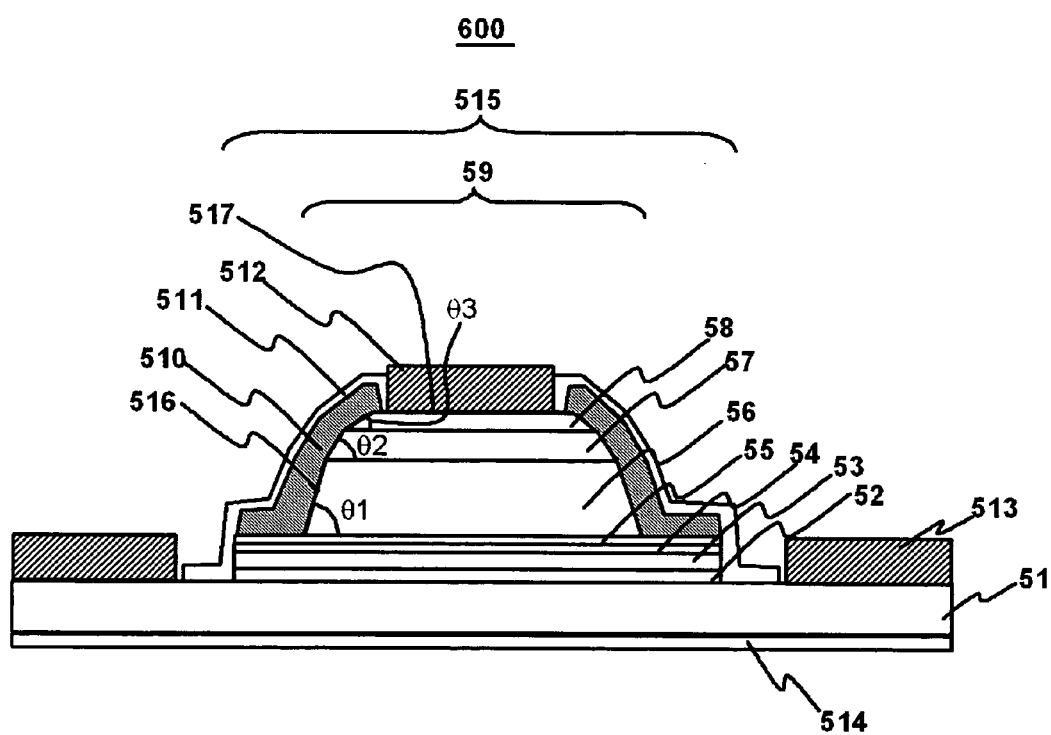
FIG. 6 is a cross-sectional view showing the structure of a mesa photodiode (a mesa avalanche photodiode) according to a sixth embodiment.

FIG. 6 is a cross-sectional view showing the structure of a mesa photodiode (a mesa APD of a back-side illuminated type) 600 according to a sixth embodiment.

As shown in FIG. 6, the mesa photodiode 600 according to this embodiment differs from the mesa photodiode 500 according to the fifth embodiment only in that the inclined angle θ3 is smaller than the inclined angle θ2. The other aspects of this mesa photodiode 600 are the same as those of the mesa photodiode 500 according to the above fifth embodiment.

More specifically, in this embodiment, the inclined angle θ2 of the inclined surface of the p-type InGaAs cap layer 57 forming the light-receiving region mesa 59 is smaller than the inclined angle θ1 of the inclined surface of the p⁻-type InGaAs light-receiving layer 56 forming the light-receiving region mesa 59. The inclined angle θ3 of the inclined surface of the p⁺-type InGaAs contact layer 58 forming the light-receiving region mesa 59 is even smaller than the inclined angle θ2. In other words, the inclined angle of the inclined surface of the light-receiving region mesa 59 becomes gradually smaller in the direction from the lower end to the upper end of the light-receiving region mesa 59. More specifically, the inclined angle of the inclined surface of the light-receiving region mesa 59 becomes smaller stepwise in the direction from the lower end to the upper end of the light-receiving region mesa 59.

The structure in which the inclined angle θ3 is smaller than the inclined angle θ2 can be realized by controlling the adhesion between the etching mask and the p⁺-type InGaAs contact layer 58 at the time of mesa etching. More specifically, the adhesion between the etching mask and the p⁺-type InGaAs contact layer 58 is made lower than in the fifth embodiment, so that the light-receiving region mesa 59 in which the inclined angle θ3 is smaller than the inclined angle θ2 can be formed. Alternatively, the dopant density difference between the p⁺-type InGaAs contact layer 58 and the p-type InGaAs cap layer 57 is set larger than in the fifth embodiment, so that the light-receiving region mesa 59 in which the inclined angle θ3 is smaller than the inclined angle θ2 can be formed.

According to the above sixth embodiment, the same effects as those of the fifth embodiment can be achieved.

Next, Example 5 is described. Example 5 is an example of the sixth embodiment.

In Example 5, the film thickness of the n-type semiconductor buffer layer 52 is approximately 1 μm, the film thickness of the undoped InAlAs multiplication layer 53 is 0.2 to 0.3 μm, the film thickness of the p-type InAlAs field buffer layer 54 is 20 to 100 nm, the film thickness of the p-type InP etching stopper layer 55 is 20 to 100 nm, the film thickness of the p⁻-type InGaAs light-absorbing layer 56 is 0.5 to 2 μm, the film thickness of the p-type InGaAs cap layer 57 is approximately 0.2 μm, and the film thickness of the p⁺-type InGaAs contact layer 58 is approximately 0.2 μm. The diameter of the light-receiving region mesa 59 is approximately 30 to 50 μm. In the bottom-face polishing performed on the bottom face of the n-type InP substrate 51 after the formation of the p-electrode 512 and the n-electrode 513, the polishing is performed so that the n-type InP substrate 51 has a thickness of approximately 150 μm.

In the mesa photodiode 600 manufactured according to Example 5, the breakdown voltage Vbr (being defined with the dark current as 10 μA) is 20 to 45 V, and the dark current obtained when a bias voltage of 0.9 Vbr is applied is a low dark current of approximately 40 nA or less. Also, GHz response characteristics are confirmed, and the temporal stability of the dark current is confirmed to have highly reliable characteristics without an increase in dark current even after 5,000 hours in aging at 150° C.

[Seventh Embodiment]

FIG. 3 is an enlarged cross-sectional view of part of the light-receiving region mesa 59 of a mesa photodiode (a mesa APD of a back-side illuminated type, the entire view of which is not provided) according to a seventh embodiment.

The mesa photodiode according to this embodiment differs from the mesa photodiode 600 according to the sixth embodiment only in that the inclined angle of the inclined surface of the sidewall 516 of the light-receiving region mesa 59 becomes continuously smaller in the direction from the lower end to the upper end of the light-receiving region mesa 59. The other aspects of this mesa photodiode are the same as those of the mesa photodiode 600 according to the above sixth embodiment.

The structure in which the inclined angle of the inclined surface of the sidewall 516 of the light-receiving region mesa 59 becomes continuously smaller in the direction from the lower end to the upper end of the light-receiving region mesa 59 can be realized by continuously increasing the dopant density in the p⁻-type InGaAs light-absorbing layer 56, the p-type InGaAs cap layer 57, and the p⁺-type InGaAs contact layer 58 forming the light-receiving region mesa 59, in the direction from the lower end to the upper end of the light-receiving region mesa 59, for example.

According to the above seventh embodiment, the same effects as those of the sixth embodiment can be achieved.

[Eighth Embodiment]

Figure 7:
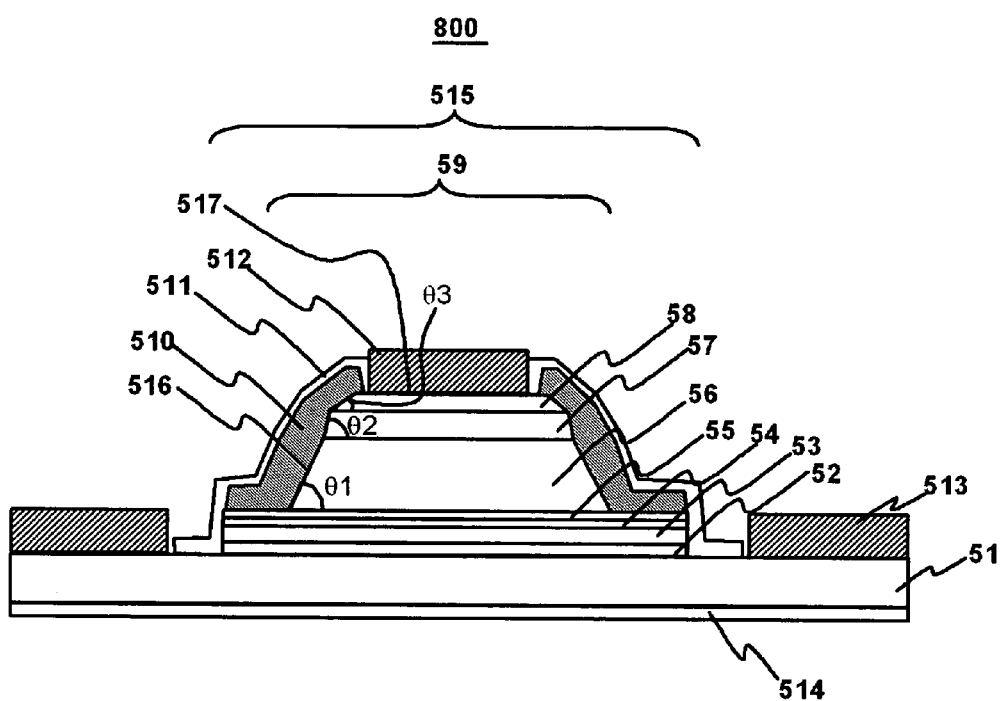
FIG. 7 is a cross-sectional view showing the structure of a mesa photodiode (a mesa avalanche photodiode) according to an eighth embodiment.

FIG. 7 is a cross-sectional view showing the structure of a mesa photodiode (a mesa APD of a back-side illuminated type) 800 according to an eighth embodiment.

As shown in FIG. 7, the mesa photodiode 800 according to this embodiment differs from the mesa photodiode 500 according to the fifth embodiment only in that the inclined angle θ2 is larger than the inclined angle θ1. The other aspects of the mesa photodiode 800 are the same as those of the mesa photodiode 500 according to the fifth embodiment.

The structure in which the inclined angle θ2 is larger than the inclined angle θ1 can be realized by controlling the dopant density difference between the p⁻-type InGaAs light-absorbing layer 56 and the p-type InGaAs cap layer 57, for example. More specifically, this structure can be realized by setting the dopant density in the p-type InGaAs cap layer 57 is lower than that in the fifth embodiment, for example.

According to the above eighth embodiment, the same effects as those of the fifth embodiment can be achieved.

Next, Example 6 is described. Example 6 is an example of the eighth embodiment.

In Example 6, the film thickness of the n-type semiconductor buffer layer 52 is approximately 1 μm, the film thickness of the undoped InAlAs multiplication layer 53 is 0.2 to 0.3 μm, the film thickness of the p-type InAlAs field buffer layer 54 is 20 to 100 nm, the film thickness of the p-type InP etching stopper layer 55 is 20 to 100 nm, the film thickness of the p⁻-type InGaAs light-absorbing layer 56 is 0.5 to 2 μm, the film thickness of the p-type InGaAs cap layer 57 is approximately 0.2 μm, and the film thickness of the p⁺-type InGaAs contact layer 58 is approximately 0.2 μm. The diameter of the light-receiving region mesa 59 is approximately 30 to 50 μm. In the bottom-face polishing performed on the bottom face of the n-type InP substrate 51 after the formation of the p-electrode 512 and the n-electrode 513, the polishing is performed so that the n-type InP substrate 51 has a thickness of approximately 150 μm.

In the mesa photodiode 800 manufactured according to Example 6, the breakdown voltage Vbr (being defined with the dark current as 10 μA) is 20 to 45 V, and the dark current obtained when a bias voltage of 0.9 Vbr is applied is a low dark current of approximately 40 nA or less. Also, GHz response characteristics are confirmed, and the temporal stability of the dark current is confirmed to have highly reliable characteristics without an increase in dark current even after 5,000 hours in aging at 150° C.

In each of the above embodiments, the regrown layer is an undoped semiconductor (the undoped InP layer 17, the undoped InP layer 510). The same effects as above can be achieved, even if the regrown layer is formed with a p-type or n-type low-density InP layer of approximately $5 \times 10^{16}$ cm$^{-3}$ in density, or a semi-insulating InP layer.

In each of the above embodiments, a mesa is formed with an InP etching stopper layer (the undoped InP etching stopper layer 13, the p-type InP etching stopper layer 55). However, a mesa photodiode having a layer structure that does not include such an InP etching stopper layer is called as a reference embodiment. With this mesa photodiode of the reference embodiment, the same effects as those of each of the above embodiments can be achieved, as long as the shape of the light-receiving region mesa is the same as the shape of each of the light-receiving region mesas 19 or 59 in the above embodiments.

The n-electrode 111 is formed under the bottom face of the n-type InP substrate 11 in the first through third embodiments, and the n-electrode 411 is formed on the surface side of the high-resistance InP substrate 41 in the fourth embodiment. However, as in the fourth embodiment, the n-electrode 111 may be formed on the surface side of the n-type InP substrate 11 in the first through third embodiments. Alternatively, as in the first through third embodiments, the n-electrode 411 may be formed under the bottom face of the high-resistance InP substrate 41 in the fourth embodiment. In either case, the same effects as those of each of the first through fourth embodiments can be achieved.

In the first through fourth embodiments, each mesa photodiode (the mesa photodiode 100, 200, or 400) may include an etching stopper layer made of a semiconductor of the first conductivity type (the n-type), instead of the etching stopper layer made of an undoped semiconductor (the undoped InP etching stopper layer 13).

In the first through fourth embodiments, each mesa photodiode may include a light-absorbing layer made of a semiconductor of the first or second conductivity type, instead of the light-absorbing layer made of an undoped semiconductor (the undoped InGaAs light-absorbing layer 14).

In each of the fifth through eighth embodiments, the p-type field buffer layer is formed with an InAlAs layer. However, the p-type field buffer layer may be formed with a p-type InAlGaAs layer, a p-type InP layer, or a p-type InGaAsP layer.

In the fifth through eighth embodiments, each mesa photodiode 500, 600, or 800 may include an multiplication layer made of a semiconductor of the first conductivity type (the n- or p-type), instead of the multiplication layer made of an undoped semiconductor (the undoped InAlAs multiplication layer 53).

In the second and sixth embodiments, the inclined angle of the inclined surface of each of the light-receiving region mesas 19 and 59 becomes smaller stepwise in the direction from the lower end to the upper end of each of the light-receiving region mesas 19 and 59. In the third and seventh embodiments, the inclined angle of the inclined surface of each of the light-receiving region mesas 19 and 59 becomes continuously smaller in the direction from the lower end to the upper end of each of the light-receiving region mesas 19 and 59. However, the present invention is not limited to those examples, and the light-receiving region mesas 19 and 59 may be designed so that the inclined surface of each of the light-receiving region mesas 19 and 59 includes a portion in which the inclined angle becomes smaller stepwise in the direction toward the upper end, and a portion in which the inclined angle becomes continuously smaller in the direction toward the upper end. Likewise, the inclined angle of at least part of the inclined surface of each of the light-receiving region mesas 19 and 59 of the fourth and eighth embodiments may become continuously smaller in the direction toward the upper end.

It is apparent that the present invention is not limited to the above embodiment, and may be modified and changed without departing from the scope and spirit of the invention.

What is claimed is:

1. A mesa photodiode comprising:
    a stack structure that is formed on a semiconductor substrate, said stack structure comprising:
        a buffer layer comprising a semiconductor of a first conductivity type;
        an etching stopper layer comprising a semiconductor of a second conductivity type, formed above said buffer layer;
        a light-absorbing layer comprising a semiconductor of the second conductivity type, formed above said etching stopper layer;
        a double-layer semiconductor layer of the second conductivity type formed above said light-absorbing layer;
        a multiplication layer that is stacked and grown on said buffer layer and comprises a semiconductor of the first conductivity type or an undoped type, and
        a field buffer layer that is stacked and grown on said multiplication layer and comprises a semiconductor of the second conductivity type,
    said double-layer semiconductor layer of the second conductivity type and said light-absorbing layer forming a mesa,
    a sidewall of said mesa being an inclined surface that is inclined in a direction in which a bottom of said mesa becomes wider,
    at least said sidewall of said mesa being covered with a semiconductor layer that is grown on said sidewall, said semiconductor layer being of the first conductivity type, the second conductivity type, a semi-insulating type, or the undoped type,
    an inclined angle of said inclined surface of said mesa at an upper end portion being smaller than an inclined angle of said inclined surface of said mesa at a lower end portion, and
    wherein said mesa photodiode comprises a mesa avalanche photodiode.

2. The mesa photodiode as claimed in claim 1, wherein the inclined angle of said inclined surface becomes gradually smaller in a direction from a lower end to an upper end of said mesa.

3. The mesa photodiode as claimed in claim 2, wherein the inclined angle of said inclined surface becomes smaller stepwise in the direction from the lower end to the upper end of said mesa.

4. The mesa photodiode as claimed in claim 2, wherein the inclined angle of said inclined surface continuously becomes smaller in the direction from the lower end to the upper end of said mesa.

5. The mesa photodiode as claimed in claim 1, further comprising a top surface of said mesa, wherein said top surface is covered with said semiconductor layer that is grown on said sidewall.

6. The mesa photodiode as claimed in claim 5, wherein said semiconductor layer is grown on said top surface of said mesa.

7. The mesa photodiode as claimed in claim 6, further comprising an electrode disposed on the top surface of said mesa.

8. The mesa photodiode as claimed in claim 5, wherein the semiconductor layer grown on the top surface of the mesa comprises an undoped layer.

9. The mesa photodiode as claimed in claim 1, further comprising a cap layer,
    wherein an inclined angle of an inclined surface of the cap layer is equal to the inclined angle of the inclined surface at the upper end portion of said mesa.

10. The mesa photodiode as claimed in claim 1, further comprising a cap layer,
    wherein the inclined angle of the inclined surface at the upper end portion of said mesa is smaller than an inclined angle of an inclined surface of the cap layer.

11. A method for manufacturing a mesa photodiode, comprising:
- forming a stack structure on a semiconductor substrate by stacking and growing a buffer layer comprising a semiconductor of a first conductivity type, an etching stopper layer comprising a semiconductor of a second conductivity type, above said buffer layer, a light-absorbing layer comprising a semiconductor of the second conductivity type, above said etching stopper layer, and a double-layer semiconductor layer of the second conductivity type above said light-absorbing layer;
- processing said double-layer semiconductor layer of the second conductivity type and said light-absorbing layer into a mesa; and
- covering at least a sidewall of said mesa with a semiconductor layer that is grown on at least said sidewall, said semiconductor layer being of the first conductivity type, the second conductivity type, a semi-insulating type, or an undoped type, and
- said processing the double-layer semiconductor layer and the light-absorbing layer including forming the sidewall of said mesa on an inclined surface that is inclined in a direction in which a bottom of said mesa becomes wider, and controlling an inclined angle of said inclined surface of said mesa at an upper end portion to be smaller than an inclined angle of said inclined surface of said mesa at a lower end portion,
- wherein said forming the stack structure includes stacking and growing a multiplication layer comprising a semiconductor of the first conductivity type or the undoped type on said buffer layer, a field buffer layer comprising a semiconductor of the second conductivity type on said multiplication layer, said etching stopper layer of the second conductivity type on said field buffer layer, and said light-absorbing layer of the second conductivity type on said etching stopper layer in this order, and
- said mesa photodiode comprises a mesa avalanche photodiode.

12. The method as claimed in claim 11, wherein said covering at least the sidewall includes growing said semiconductor layer on said sidewall and a top surface of said mesa, and
after said covering at least the sidewall, an electrode is formed on said top surface of said mesa, and said semiconductor layer is left at least on said sidewall.

13. The method as claimed in claim 12, wherein said semiconductor layer is regrown on the sidewall and the top surface of said mesa.

* * * * *